United States Patent
Wells et al.

(10) Patent No.: US 10,868,681 B2
(45) Date of Patent: Dec. 15, 2020

(54) NETWORK LINK BREAKER

(71) Applicant: Schweitzer Engineering Laboratories, Inc., Pullman, WA (US)

(72) Inventors: Tim L. Wells, Pullman, WA (US); David M. Rector, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 122 days.

(21) Appl. No.: 16/237,117

(22) Filed: Dec. 31, 2018

(65) Prior Publication Data
US 2020/0213143 A1  Jul. 2, 2020

(51) Int. Cl.
*H04L 12/12* (2006.01)
*H01H 9/16* (2006.01)
*H04L 12/10* (2006.01)
*H03K 3/037* (2006.01)

(52) U.S. Cl.
CPC ............. *H04L 12/12* (2013.01); *H01H 9/161* (2013.01); *H04L 12/10* (2013.01); *H03K 3/037* (2013.01)

(58) Field of Classification Search
None
See application file for complete search history.

(56) References Cited

U.S. PATENT DOCUMENTS

| | | | | |
|---|---|---|---|---|
| 6,175,865 B1* | 1/2001 | Dove | ................. | G06F 13/4072 709/220 |
| 6,622,178 B1* | 9/2003 | Burke | ................... | G06F 1/3209 710/109 |
| 7,278,039 B1* | 10/2007 | Lo | ......................... | H04L 12/12 713/320 |
| 7,904,623 B2* | 3/2011 | Simmons | ................ | H04L 49/40 710/106 |
| 8,560,754 B2* | 10/2013 | Mueller | .............. | G06F 13/4072 710/313 |
| 8,908,715 B2* | 12/2014 | Woodruff | ............ | H04L 12/4625 370/463 |
| 9,548,731 B2* | 1/2017 | Shah | .................... | H01L 21/8252 |
| 2007/0100504 A1 | 5/2007 | Moxley | | |
| 2007/0109098 A1 | 5/2007 | Siemon | | |
| 2007/0114987 A1 | 5/2007 | Kagan | | |
| 2007/0147354 A1* | 6/2007 | He | ........................ | H04L 12/407 370/352 |

(Continued)

*Primary Examiner* — Elias Mamo
(74) *Attorney, Agent, or Firm* — Jared L. Cherry

(57) ABSTRACT

The present disclosure pertains to systems and methods to selectively interrupt a communication link. In one embodiment, a system may comprise a first communication port and a second communication port, each of which comprises a plurality of differential pairs of electrical wires. A control select circuit may be in communication with the first communication port and the second communication port and may comprise a plurality of solid-state switches operable to transition between a first configuration and a second configuration. In the first configuration the differential pairs of electrical wires are electrically connected to corresponding differential pairs of electrical wires in the second communication port. In the second configuration, the differential pairs of wires are shunted through a resistor to dissipate energy associated with an electrical signal. A control port may be operable to cause the plurality of solid-state switches to transition between the first configuration and the second configuration.

20 Claims, 4 Drawing Sheets

(56) References Cited

U.S. PATENT DOCUMENTS

| | | |
|---|---|---|
| 2007/0147415 A1 | 6/2007 | Marusca |
| 2010/0002879 A1 | 1/2010 | Risley |
| 2010/0070638 A1 | 3/2010 | Bhatt |
| 2010/0231054 A1 | 9/2010 | Togawa |
| 2012/0233296 A1 | 9/2012 | Wimmer |
| 2012/0304279 A1 | 11/2012 | Hargis |
| 2013/0031201 A1 | 1/2013 | Kagan |
| 2013/0105082 A1 | 5/2013 | Melikyan |
| 2013/0227323 A1 | 8/2013 | Stafford |
| 2013/0271016 A1 | 10/2013 | Shuy |
| 2015/0113125 A1 | 4/2015 | Chamberlin |
| 2016/0094578 A1 | 3/2016 | McQuillan |
| 2016/0277216 A1 | 9/2016 | Carson |

* cited by examiner

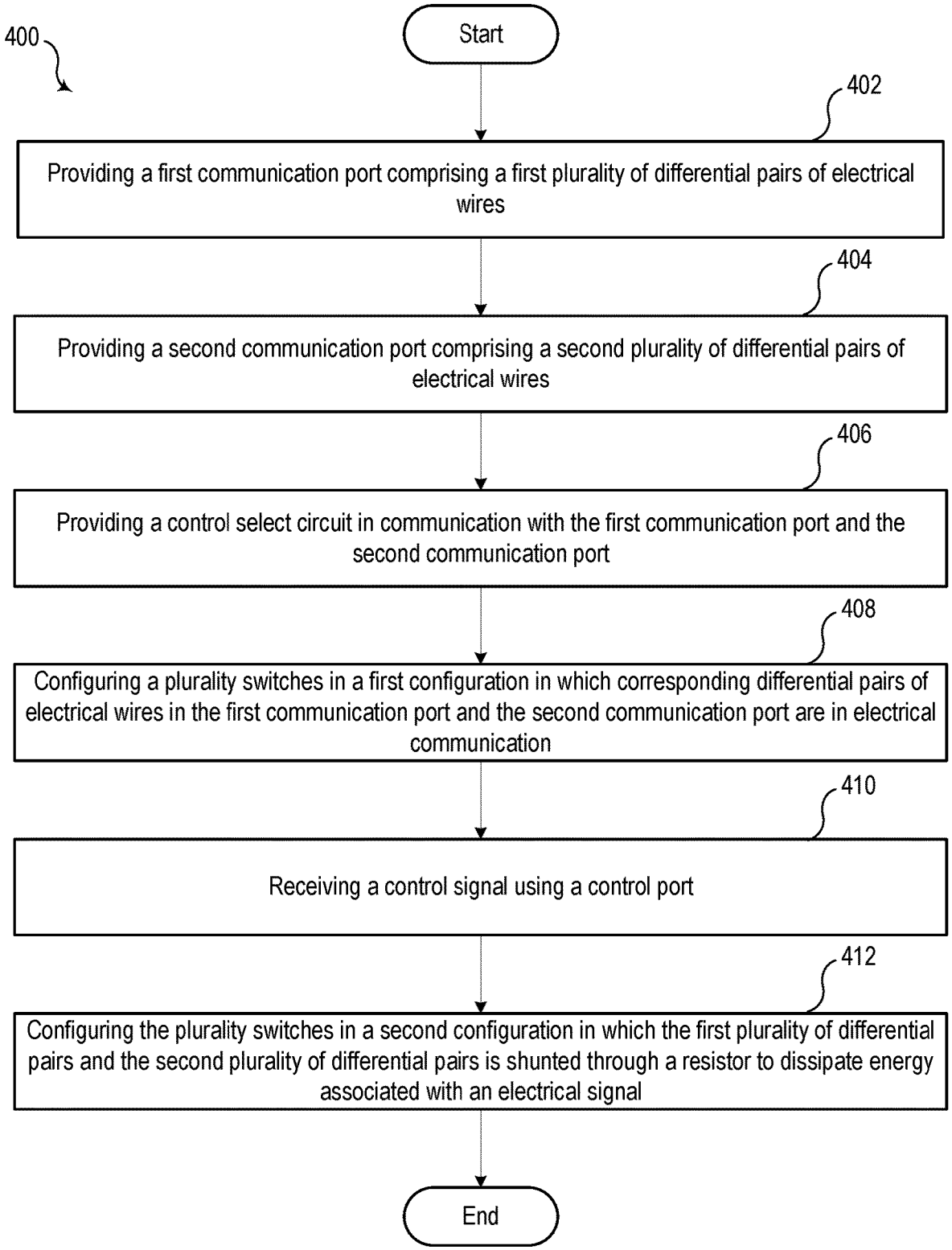

NETWORK LINK BREAKER

TECHNICAL FIELD

This disclosure relates to systems and methods for selectively activating and/or interrupting network connections. More particularly, but not exclusively, the present disclosure discloses switching devices that may be used to selectively connect and disconnect network links for a variety of purposes, such as testing a network's response to changes in the network, responding to cybersecurity risks, controlling access to a network, etc.

BRIEF DESCRIPTION OF THE DRAWINGS

Non-limiting and non-exhaustive embodiments of the disclosure are described, including various embodiments of the disclosure, with reference to the figures, in which:

FIG. 4 illustrates a flowchart of a method of using a link breaker that may be used to break a network connection consistent with embodiments of the present disclosure.

DETAILED DESCRIPTION

Figure 1:
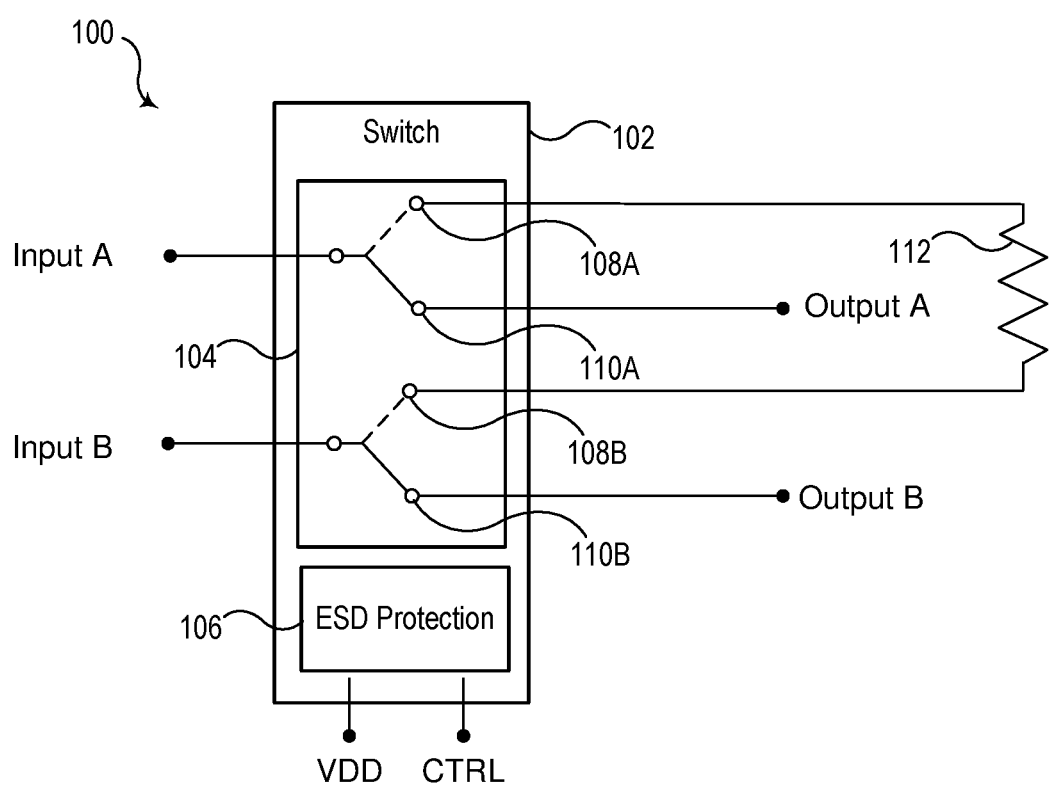
FIG. 1 illustrates a conceptual representation of a link breaker that may be used to selectively break a network connection consistent with the present disclosure.

The present disclosure pertains to various systems and methods for selectively activating and/or interrupting network connections. In various embodiments, the systems and methods disclosed herein may utilize a switching circuit to transmit or to block a network signal. The switching circuit may transmit a signal from one or more input ports to one or more output ports in a first configuration and may block the signal in a second configuration. The switching circuit may be embodied using a variety of technologies.

In various embodiments, systems consistent with the present disclosure may activate or interrupt electrical connections between network devices in connection with a variety of applications. For example, systems and methods disclosed herein may be used to test the response of a network to the failure of one or more physical communication links. Such testing may allow network operators to identify potentially disruptive points of failure within a network. In another example, systems and methods disclosed herein may be used to selectively permit or block connections to a network. Network connections may be blocked when such connections are associated with suspicious activity (e.g., a suspected cyberattack). A variety of other applications are described below and will be apparent to one of skill in the art.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc. that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium media suitable for storing electronic and/or processor executable instructions.

FIG. 1 illustrates a conceptual representation of a system 100 that may be used to selectively break a network connection in various embodiments consistent with the present disclosure. System 100 includes a switch 102 in communication with port 1 and port 2. In various embodiments, port 1 and port 2 may be associated with differential pairs in an Ethernet connection, a serial connection, a USB connection, or other type of electrical communication system.

In the illustrated embodiment, switch 102 is a double-pull-double-throw switch, in which the CTRL input controls the connection between the input ports and the output ports. Based on the CTRL input, switch 102 connects Input A to one of outputs 108A and 110A and connects Input B to one of outputs 108B and 110B. Outputs 110A and 110B may be connected to other components. As such, when Input A and Input B are connected to Output A and Output B, a signal may pass through switch 102. In one embodiment, when the control voltage is low, switch 102 may pass the signal from Input A to Output A and from Input B to Output B. In this embodiment, when the control voltage is high, Input A and Input B may be connected to outputs 108A and 108B. Outputs 108A and 108B are connected to a resistor 112, which breaks the data path between Input A and Output B and Input B and Output B. In one specific embodiment, switch 102 may be embodied using part no. BGS22WL10 available from Infineon Technologies AG of Neubiberg, Germany.

Shunting the signal on Input A and Input B to resistor 112 may reduce the time for a device to recognize a change in the status of a communication link. In alternative embodiments, outputs 108A and 108B may remain open or may be coupled to ground; however, such configurations may exhibit reduced speed in comparison to shunting a differential signal through a resistor.

System 100 is a self-contained, independent circuit that does not require controlling circuitry or independent physical layer control in the OSI model. Switch 102 may receive power from a power input, VDD. Further, an electrostatic discharge (ESD) protection circuit 106 may isolate Input A and Input B from the power and control signals. System 100 may operate independently of the communication equipment in communication with Input A, Input B, Output A, and Output B.

Figure 2:
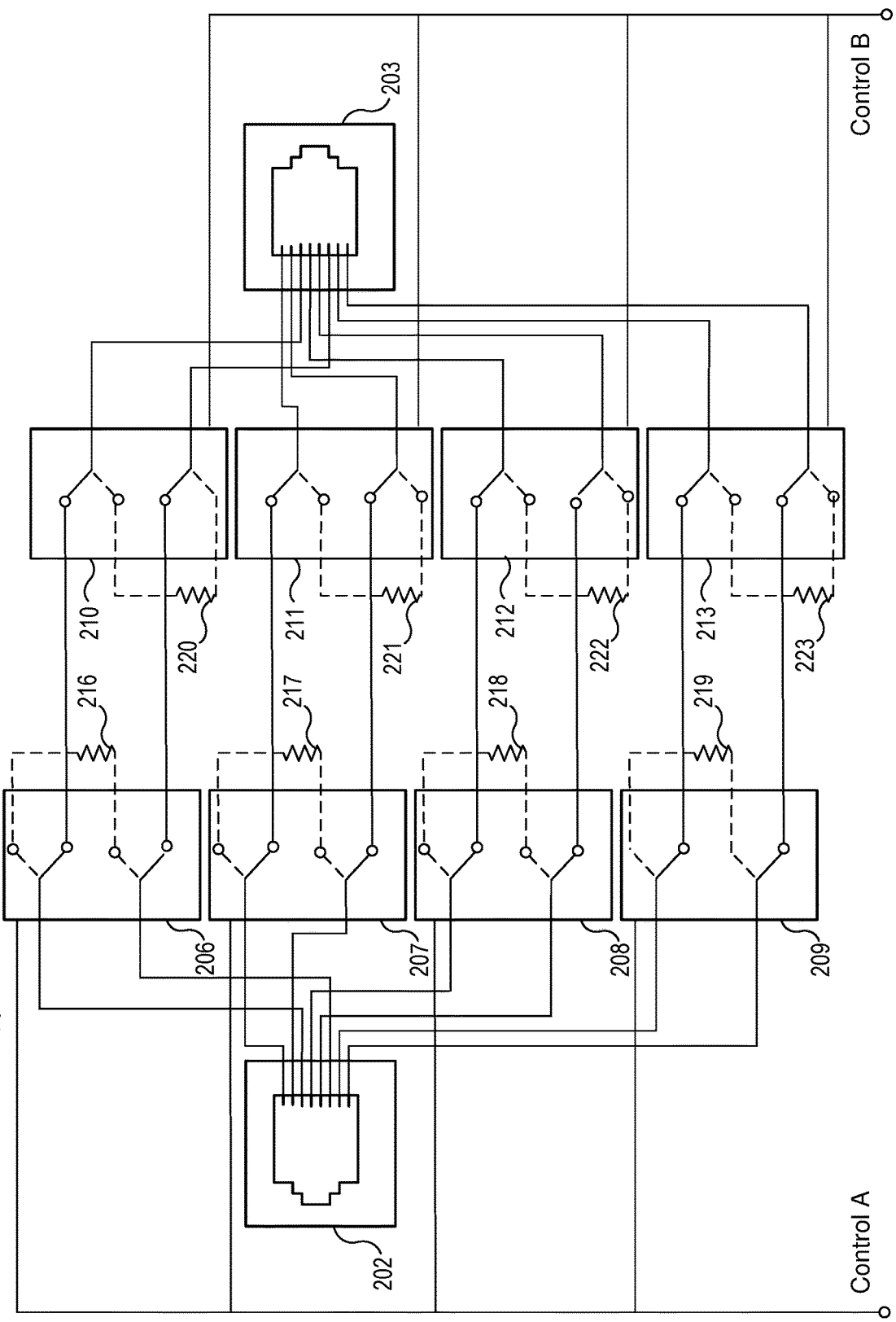
FIG. 2 illustrates a conceptual representation of a system comprising a plurality of link breakers that may be used to selectively break a network connection between two Ethernet ports consistent with embodiments of the present disclosure.

FIG. 2 illustrates a conceptual representation of a system 200 comprising a plurality of link switches 206-213 that may be used to selectively break a network connection between two Ethernet ports 202, 203 consistent with the present disclosure. Although the illustrated embodiment includes Ethernet ports, system 200 may be readily adopted to a variety of other types of communication ports, such as serial ports, parallel ports, USB ports, IEEE 1394 ports, and the like.

An Ethernet port comprises four differential pairs. Each switch 206-213 in system 200 is associated with one of the differential pairs. When an Ethernet device is connected, negotiation takes place that determines which differential pairs of wires are used to transmit and which are used to receive. Such a negotiation may allow a connection to detect if the connection would require a crossover and automatically choose between a medium dependent interface (MDI) or a medium dependent interface crossover (MDI-X) configuration to properly match the other end of the link. As a result, system 200 includes a switch on each side of the circuit, for a total of eight switches, to accommodate different configurations based on the negotiation.

Each switch 206-213 is a DPDT switch that selectively connects an input to one of two outputs. Each switch 206-213 receives a differential pair of wires from Ethernet ports 202, 203. In various embodiments, switches 206-213 may be embodied by solid-state devices. Solid-state devices may transition without a bounce when the signal is shunted to resistors 216-223. Further, solid-state devices may provide rapid switching times. In one specific embodiment, the switching time may be less than 4 μs. System 200 may also be operable at high data transfer speeds. In specific embodiments, system 200 may be used in data transmission systems operating at frequencies up to 3 GHz. System 200 may also be implemented in systems that operate using standardized data rates of 10, 100, and/or 1,000 Mbps.

A signal associated with each differential pair of wires may be passed or may be blocked depending on a control signal. In the illustrated embodiment, two control signals, Control A and Control B, are illustrated. Switches 206-209 are controlled by Control A, and switches 210-213 are controlled by Control B. System 200 may block a signal from passing from Ethernet ports 202, 203 based on either Control A or Control B, which may be independently controlled.

Depending on the status of Control A and Control B, a signal may either be transmitted by switches 206-213 or shunted to resistors 216-223. If a differential signal is shunted to any of resistors 216-223, the signal is blocked from passing through system 200. The energy associated with the blocked signal is dissipated by one or more of resistors 216-223.

System 200 may be utilized in a variety of applications. For example, system 200 may be used as a network tester that temporarily disables a communication link, thus allowing an operator to determine how the network would reconfigure itself using various protocols, such as rapid spanning tree protocol, which may allow a network to adopt to network changes or failures. In another example, system 200 may be used to disconnect a communication path if an intrusion is detected or to block a Denial of Service attack.

Figure 3:
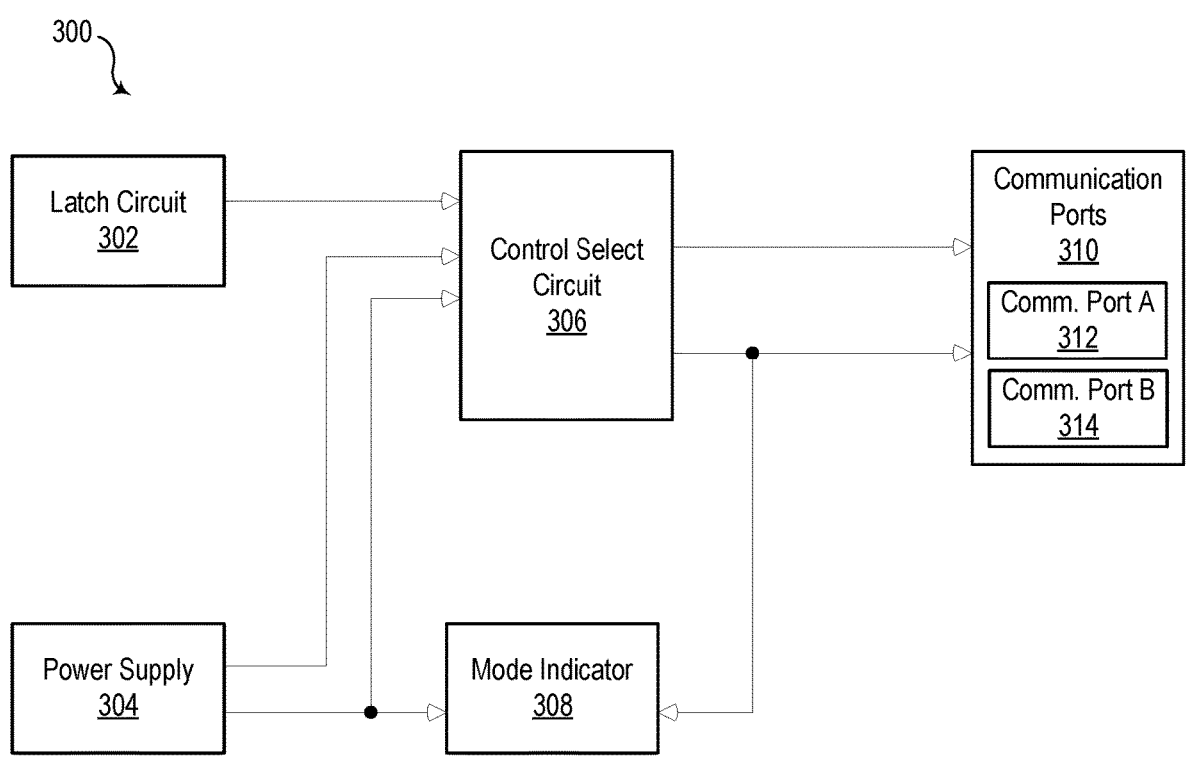
FIG. 3 illustrates a functional block diagram of a system that may be used to selectively break a network connection between communication ports consistent with the present disclosure.

FIG. 3 illustrates a functional block diagram of a system 300 that may be used to selectively break a network connection between communication ports 310 consistent with the present disclosure. A latch circuit 302 may be utilized to toggle between a first configuration, in which a signal is passed from one communication port to another communication port, and a second configuration, in which a signal is blocked from passing from one communication port to another communication port. Latch circuit 302 may be triggered by an electrical signal or by manual actuation (e.g., push button, a dip switch, etc.).

The latch circuit 302 is in communication with a control select circuit 306 that controls whether signals pass through communication ports 310. Latch circuit 302 may generate a control signal used to selectively enable or disable communication between communication ports 310. In various embodiments, latch circuit 302 may be manually actuated, or may be configured to receive a signal from another electronic device.

A power supply 304 may provide electrical energy to system 300. In some embodiments, power supply 304 may be embodied as a power connection configured to receive a supply of power from an external source. In other embodiments power supply 304 may comprise a battery so that system 300 may operate without an external power supply. In one specific embodiment, power supply 304 may comprise a USB port. USB connectors are commonly available, and as such, may provide a convenient source of power for system 300. Still further, in some embodiments electrical power may be received from communication ports 310, where communication ports 310 are suitable to provide power to other devices, such as a power-over-Ethernet port, an IEEE 1394 port, a USB port, etc. In one specific embodiment, a Universal Asynchronous Receiver/Transmitter ("UART") may also be provided and used to communicate control signals to system 300. In one specific embodiment, the UART may be comprised within power supply 304 and may be embodied using a USB connector. Such control signals may be communicated to selectively enable or disable communication between communication ports 310, either through latch circuit 302 or through communication with control select circuit 306.

A control select circuit 306 may selectively enable or disable communication between communication ports 310. In various embodiments, control select circuit 306 may comprise a plurality of switches, such as switch 100, illustrated in FIG. 1. Further, where communication ports 310 comprise Ethernet ports, control select circuit 306 may be embodied by system 200, illustrated in FIG. 2. Based on the configuration of the plurality of switches, a signal may either be transmitted from communication port A 312 to communication port B 314 or may be blocked.

A mode indicator 308 may provide an indication of whether system 300 is in the first configuration, in which a signal is passed from one communication port to another communication port, and a second configuration, in which a signal is blocked from passing from one communication port to another communication port. In one specific embodiment, the mode indicator 308 may comprise a bicolor light-emitting diode (LED) that provides a visual indication of whether system 300 is in the first configuration or the second configuration based on the color of the LED. For example, if the LED emits green light, communication between communication ports 310 is enabled, and if the LED emits red light, communication between communication ports 310 is disabled.

Communication ports 310 may be embodied as a variety of electronic communication ports. In various embodiments, communication ports 310 may be embodied as Ethernet or RJ45 ports, USB ports, IEEE 1394 ports or Firewire ports, eSATA ports, serial or RS-232 ports, parallel ports, and the like.

FIG. 4 illustrates a flowchart of a method 400 of using a link breaker that may be used to break a network connection consistent with embodiments of the present disclosure. At 402, a first communication port comprising a plurality of differential pairs of electrical wires may be provided. At 404, a second communication port comprising a plurality of differential pairs of electrical wires may be provided. At 406, a control select circuit in communication with the first communication port and the second communication port may be provided. The control select circuit may comprise a plurality of switches that control electrical connections between the first communication port and the second communication port.

At 408, the plurality of switches may be configured in a first configuration in which corresponding differential pairs of electrical wires in the first communication port are in electrical communication with corresponding differential pairs of electrical wires in the second communication port. In the first configuration, an electrical signal may pass from the first communication port to the second communication port.

At 410, a control signal may be received using a control port. The control signal may be received from a user or may be received from another electrical system. In one embodiment, the control signal may be generated by a latch circuit controlled by a button that may be pressed by a user. In other embodiments, the control signal may be generated at a specific time or to induce a particular action or series of actions.

At 412, the plurality of switches may be configured in a second configuration in which the first plurality of differential pairs and the second plurality of differential pairs is shunted through a resistor to dissipate energy associated with an electrical signal. When operating in the second configuration, the plurality of switches may block the electrical signal from passing from the first communication port to the second communication port.

While specific embodiments and applications of the disclosure have been illustrated and described, it is to be understood that the disclosure is not limited to the precise configurations and components disclosed herein. Many changes may be made to the details of the above-described embodiments without departing from the underlying principles of this disclosure. The scope of the present invention should, therefore, be determined only by the following claims.

What is claimed is:

1. A system to selectively interrupt a communication link, the system comprising:
a first communication port comprising a first plurality of differential pairs of electrical wires;
a second communication port comprising a second plurality of differential pairs of electrical wires;
a control select circuit in communication with the first communication port and the second communication port, the control select circuit comprising:
a plurality of solid-state switches, each of the solid-state switches configured to transition between:
a first configuration in which differential pairs of electrical wires in the first communication port are electrically connected to corresponding differential pairs of electrical wires in the second communication port;
a second configuration in which the first plurality of differential pairs and the second plurality of differential pairs is shunted through a resistor configured to dissipate energy associated with an electrical signal and thereby to selectively interrupt the communication link between the first communication port and the second communication port in the second configuration; and
a control port in electrical communication with the plurality of solid-state switches and configured to cause the plurality of solid-state switches to transition between the first configuration and the second configuration based on a control signal.

2. The system of claim 1, wherein the plurality of solid-state switches transition from the first configuration to the second configuration in about 4 microseconds.

3. The system of claim 1, wherein the plurality of solid-state switches comprise a single-pole, double-throw radio frequency switch.

4. The system of claim 1, further comprising a power supply to provide power to the control select circuit.

5. The system of claim 3, wherein the power supply comprises a universal serial bus connection.

6. The system of claim 1, wherein the first communication port and the second communication port each comprise an Ethernet port.

7. The system of claim 6, wherein the plurality of solid-state switches comprise:
a first subset in communication with the first communication port;
a second subset in communication with the second communication port;
wherein the first subset and the second subset are symmetrically arranged to accommodate both a medium dependent interface (MDI) and a medium dependent interface crossover (MDI-X) configuration.

8. The system of claim 1, further comprising a mode indicator to provide a first indication corresponding to the first configuration and a second indication corresponding to the second configuration.

9. The system of claim 1, further comprising a latch circuit in communication with the control select circuit and configured to generate the control signal.

10. The system of claim 1, wherein at least one of the first communication port and the second communication port comprises at least one of a serial port, a parallel port, a USB port, and an IEEE 1394 port.

11. A method to selectively interrupt a communication link, the system comprising:
providing a first communication port comprising a first plurality of differential pairs of electrical wires;
providing a second communication port comprising a second plurality of differential pairs of electrical wires;
providing a control select circuit in communication with the first communication port and the second communication port, the control select circuit comprising a plurality of solid-state switches;
configuring the plurality of solid-state switches in a first configuration in which differential pairs of electrical wires in the first communication port are electrically connected to corresponding differential pairs of electrical wires in the second communication port;
receiving a control signal using a control port; and
configuring the plurality of solid-state switches in a second configuration in which the first plurality of differential pairs and the second plurality of differential pairs is shunted through a resistor to dissipate energy associated with an electrical signal to selectively interrupt the communication link between the first communication port and the second communication port in the second configuration.

12. The method of claim 11, wherein the plurality of solid-state switches transition from the first configuration to the second configuration in about 4 microseconds.

13. The method of claim 11, wherein the plurality of solid-state switches comprise a single-pole, double-throw radio frequency switch.

14. The method of claim 11, further comprising providing power to the control select circuit from a power supply.

15. The method of claim 14, wherein the power supply comprises a universal serial bus connection.

16. The method of claim 11, wherein the first communication port and the second communication port each comprise an Ethernet port.

17. The method of claim 16, further comprising:
providing a first subset in communication with the first communication port;
providing a second subset in communication with the second communication port;
wherein the first subset and the second subset are symmetrically arranged to accommodate both a medium dependent interface (MDI) and a medium dependent interface crossover (MDI-X) configuration.

18. The method of claim 11, further comprising providing a first indication corresponding to the first configuration and providing a second indication corresponding to the second configuration.

19. The method of claim 11, further comprising providing a latch circuit in communication with the control select circuit and configured to generate the control signal.

20. The method of claim 11, wherein at least one of the first communication port and the second communication port comprises at least one of a serial port, a parallel port, a USB port, and an IEEE 1394 port.

* * * * *